(12) United States Patent
Lindstrom et al.

(10) Patent No.: US 9,251,963 B2
(45) Date of Patent: Feb. 2, 2016

(54) DYE SENSITIZED SOLAR CELL AND METHOD FOR MANUFACTURE

(75) Inventors: Henrik Lindstrom, Uppsala (SE); Giovanni Fili, Stockholm (SE)

(73) Assignee: NLAB Solar AB, Stockholm (SE)

(*) Notice: Subject to any disclaimer, the term of this patent is extended or adjusted under 35 U.S.C. 154(b) by 331 days.

(21) Appl. No.: 13/824,145

(22) PCT Filed: Oct. 7, 2011

(86) PCT No.: PCT/EP2011/067603
§ 371 (c)(1),
(2), (4) Date: Mar. 15, 2013

(87) PCT Pub. No.: WO2012/045881
PCT Pub. Date: Apr. 12, 2012

(65) Prior Publication Data
US 2013/0174906 A1       Jul. 11, 2013

Related U.S. Application Data

(60) Provisional application No. 61/390,780, filed on Oct. 7, 2010, provisional application No. 61/474,474, filed on Apr. 12, 2011.

(51) Int. Cl.
*H01L 21/00* (2006.01)
*H01L 31/00* (2006.01)
*H01G 9/20* (2006.01)

(52) U.S. Cl.
CPC .......... *H01G 9/2022* (2013.01); *H01G 9/2031* (2013.01); *H01G 9/2059* (2013.01); *Y02E 10/542* (2013.01)

(58) Field of Classification Search
CPC .................................................. H01G 9/2022
USPC .............................................. 438/98; 136/256
See application file for complete search history.

(56) References Cited

U.S. PATENT DOCUMENTS 8,049,105 B2    11/2011   Kuroda et al.
2003/0155004 A1*  8/2003  Takahashi et al. ............ 136/263

FOREIGN PATENT DOCUMENTS

CN           1719619 A      1/2006
CN         100481521 C      4/2009
(Continued)

OTHER PUBLICATIONS

Kashiwa et al, All-Metal-electrode-type dye sensitized solar cells . . . 2008, American Institue of Physics,Applied Physics letters, vol. 92, pp. 033308-1 to 03308-3.*

(Continued)

*Primary Examiner* — David S Blum
(74) *Attorney, Agent, or Firm* — Novak Druce Connolly Bove + Quigg LLP

(57) ABSTRACT

A method for producing a Dye-Sensitized Solar cell (DSC) comprising a substrate, a working electrode, a back contact for extracting photo-generated electrons, an electrolyte, and a counter electrode where the back contact and/or the counter electrode is formed by a porous conductive powder layer, PCPL. The PCPL is prepared by the following steps:
 a. powder preparation;
 b. powder ink preparation;
 c. powder ink deposition;
 d. powder layer heating;
 e. powder layer compaction; and
 f. powder layer after treatment.

15 Claims, 4 Drawing Sheets

(56) References Cited

FOREIGN PATENT DOCUMENTS

| | | |
|---|---|---|
| EP | 2061049 A2 | 5/2009 |
| WO | WO-2010150461 A1 | 12/2010 |

OTHER PUBLICATIONS

Gratzel et al., Low cost phtovoltaic modules based on dye sensitized nanocrystalline titanium dioxide and carbon powder, Solar Energy Materials and Solar Cells, vol. 44, No. 1, Oct. 30, 1966, pp. 99-117, XP004053970.

* cited by examiner

DYE SENSITIZED SOLAR CELL AND METHOD FOR MANUFACTURE

CROSS REFERENCE TO RELATED APPLICATIONS

This application is a National Phase filing under 35 U.S.C. §371 of PCT/EP2011/067603 filed on Oct. 7, 2011; and this application claims priority to U.S. Provisional Application No. 61/390,780 filed on Oct. 7, 2010, and U.S. Provisional Application No. 61/474,474 filed on Apr. 12, 2011 under 35 U.S.C. §119; the entire contents of all are hereby incorporated by reference.

TECHNICAL FIELD

The invention concerns the implementation of a porous layer in a dye-sensitized solar cell (DSC) and a method for manufacturing a DSC having a porous conducting electrode layer.

BACKGROUND

Dye-sensitized solar cells (DSC's) developed by M Grätzel et al are a new type of solar cells made of low-cost materials and can be manufactured by conventional printing techniques, see for example U.S. Pat. No. 5,084,365.

A conventional sandwich type DSC is shown in FIG. 1. The DSC (1) has a few micrometer thick porous $TiO_2$ electrode layer (2) deposited onto a transparent conducting substrate (3). The $TiO_2$ electrode comprises interconnected $TiO_2$ metal oxide particles dyed by adsorbing dye molecules (typically a Ruthenium polypyridyl complex) on the surface of the $TiO_2$ particles. The transparent conducting substrate (3) is normally a transparent conducting oxide (TCO) (4), for example fluorine-doped tin oxide (FTO), deposited onto a glass substrate (5). Other types of TCO materials, such as indium tin oxide (ITO), or aluminum doped zinc oxide, or antimony doped tin oxide, are used as well.

The TCO layer (4) serves the function as a back contact extracting photo-generated electrons from the $TiO_2$ electrode (2). The $TiO_2$ electrode (2) is in contact with an electrolyte (6) (typically containing $I^-/I_3^-$ ion pairs) and another transparent conducting substrate, i.e., a counter electrode (7). The TCO layer (8) of the counter electrode is usually covered with a thin catalytic layer of platinum. The platinum has a strong catalytic effect, facilitating the electron transfer to the electrolyte.

Sunlight is harvested by the dye, producing photo-excited electrons that are injected into the conduction band of the $TiO_2$ particles and further collected by the conducting substrate (8). At the same time, $I^-$ ions in the redox electrolyte reduce the oxidized dye and transport the generated electron acceptors species ($I_3^-$) to the counter electrode where the $I_3^-$ species are reduced to $I^-$. A record 11% power conversion efficiency has been reported, although good quality cells typically provide between 5% and 8%.

The edges of the conducting substrates are usually not deposited with $TiO_2$ electrode material. The two conducting substrates are sealed at the edges in order to protect the DSC components against the surrounding atmosphere, and to prevent the evaporation or leakage of the DSC components inside the cell.

Due to the low conductivity of the transparent conducting oxide (4, 8), the cells (1) must be deposited in segments or strips with gaps in between. Current collectors are deposited in the gaps to connect the segments or strips to form solar cell modules. The wider the segments the greater the electronic ohmic losses in the TCO layer because of poor TCO conductivity.

The individual cells (1) are electrically connected in parallel or in series to enhance the DSC current or DSC voltage, respectively. The electrical connection can be made outside the cells using peripheral equipment such as cables or solders. Alternatively, the electrical connection can be made inside the cells by distributing the DSC components in such a way that the desired parallel or series connection of the cells is achieved.

The low conductivity of the transparent conductive oxide, TCO, is a problem as it limits the width of the segments. Another problem is that TCO-based glass is expensive, and the use of two TCO-based glasses in the DSC construction increases the cost even further. In order to resolve these problems, attempts have been made to exchange the TCO-based glass of the back contact by vacuum deposit of a porous conductive metal layer on the $TiO_2$ by using metal sputtering techniques. Since the deposited sputtered porous metal layer is electrically conductive, the TCO-based glass can be exchanged with a TCO-less glass, which is much cheaper.

In Yohei Kashiwa, Yorikazu Yoshida, and Shuzi Hayase, PHYSICS LETTERS 92, 033308 (2008)) is described electro-spraying of a tetrapod-shaped ZnO onto the $TiO_2$ layer followed by sputtering of titanium metal on top of the ZnO covered $TiO_2$ layer. The tetrapod-shaped ZnO, which was embedded in the titanium layer, was then washed away by subsequent ZnO dissolution in HCL in order to form a sufficiently porous titanium layer. The porosity of the titanium layer must be sufficient in order not to create electrolyte ion diffusion limitations with resistive losses as a consequence. Also, the dye-sensitization process can be slowed down due to of diffusion problems through the titanium layer. Consequently, it was necessary to introduce pores in the sputtered titanium layer. The overall light-to-electric energy conversion efficiency obtained was 7.43%.

Yohei Kashiwa, Yorikazu Yoshida, and Shuzi Hayase, PHYSICS LETTERS 92, 033308 (2008)) and US2009314339 describe methods for increasing porosity of vacuum deposited metal layers. In US2009314339 a fine-particle layer is formed on the surface of the porous $TiO_2$ layer and subsequently a conductive metal film is formed on the surface of the fine-particle layer; and thereafter the fine-particle layer is removed by heating or solvent-cleaning. A sputtered porous titanium layer deposited on top of a $TiO_2$ layer is also disclosed in J. M. Kroonl, N. J. Bakker, H. J. P. Smit, P. Liska, K. R. Thampi, P. Wang, S. M. Zakeeruddin, M. Graetzel, A. Hinsch, S. Hore, U. Wurfel, R. Sastrawan, J. R. Durrant, E. Palomares, H. Pettersson, T. Gruszecki, Walter, K. Skupien and G. E. Tull, Prog. Photovolt: Res. Appl. 2007; 15:1-18 (ENK6-CT2001-00575 NANOMAX).

The overall light-to-electric energy conversion efficiency obtained was 3.6%. These scientists concluded that further research was needed in order to improve efficiency.

Vacuum-based electron beam vapor deposition has been used to deposit a porous titanium layer on top of the $TiO_2$ layer, Nobuhiro FUKE Japanese Journal of Applied Physics Vol. 46, No. 18, 2007, pp. L420-L422, Back Contact Dye-Sensitized Solar Cells vacuum process; Nobuhiro Fuke, Atsushi Fukui, Ryohichi Komiya, Ashraful Islam, Yasuo Chiba, Masatoshi Yanagida, Ryohsuke Yamanaka, and Liyuan Han, Chem. Mater. 2008, 20, 4974-4979. The overall light-to-electric energy conversion efficiency in these studies was between 7.1 and 8.4%.

Vacuum deposition of metal layers has several disadvantages:

Vacuum deposition is slow compared to other techniques, such as printing techniques.

Equipment used for vacuum deposition is relatively expensive.

Vacuum equipment requires substrates that do not give off gases under vacuum conditions.

Vacuum deposited porous metal layers have low permeability for ions in the DSC electrolyte.

Vacuum deposited porous metal layers have low permeability for dye-sensitization molecules resulting in longer dye-sensitization times.

Vacuum techniques require masking in order to deposit metal particles at the right place in the DSC.

Since deposited material is spread non-selectively on the surface the substrate in the deposition chamber, deposited metal material is wasted during deposition.

Metal targets used for vacuum deposition are expensive.

Advantages with the vacuum process are that porous metal films with both good mechanical stability and good electrical conductivity can be formed. It is probable that the advantages are partly due to that the vacuum allows for the deposition of pure metal particles in an oxygen-free atmosphere. The absence of oxygen during deposition makes it possible to form good metallic particle-to-particle contact. The particle-to-particle contact is achieved due to the metal particles having high purity and being essentially free from metal oxide on the surface. During sputtering, the substrate is bombarded with high-energy metal particles. The large physical contact area increases the binding energy between the particles and the substrate, and the binding energy in the metal particle-to-particle contact, which results in a strong mechanical adhesion of the metal particles and the substrate and a strong mechanical particle-to-particle adhesion

SUMMARY OF THE INVENTION

It is an objective of the present invention to provide a dye-sensitized solar cell, DSC with increased current-handling capability.

It is another objective of the present invention to provide a DSC that involves no or less TCO.

It is a further objective of the present invention to provide a cost-effective method for manufacturing a DSC with a porous conductive powder layer, PCPL.

The objectives of the present invention are met by a DSC comprising a porous conductive powder layer (PCPL), which increases the electrical current-handling capability of the DSC.

The PCPL is formed by depositing an electrically conductive powder (CPL), such as a metal powder, onto a substrate. Mechanical pressure is applied to the porous metal powder layer in order to form a mechanically stable layer and increase the electrical conductivity of the layer. Subsequently, the PCPL can be subjected to heat to further increase the mechanical stability and electrical conductivity.

The metal powder can be in the form of a compound of the metal when deposited. The compound is thereafter treated to undergo a reaction so that the metal is formed. The treatment can be a heat treatment.

The conducting powder may consist of titanium and/or titanium alloys and/or titanium hydrides. If titanium hydrides are used, a step for transforming the hydrides to metal is introduced.

The conducting powder may also be powders of metals like nickel, molybdenum, tungsten, cobalt, niobium, zirconium and their alloys.

Mixtures of metal powders or metal alloy powders or metal compounds can be used.

The deposition of the conductive powder can be done by printing using various techniques known in the art, such as slot die coating, gravure, spraying, screen printing, knife coating, blade coating, doctor blading, flexo printing, and dip coating. Dry powder deposition can also be used.

The conducting powder can be deposited onto various substrates or DSC components, like plastics, PET, PEN, TCO-less glass, TCO-covered glass, glass, metal, or porous substrates such as glass microfiber-based substrates, ceramic microfiber based-substrates, cellulose-based substrates, textile, ceramic paper or onto a $TiO_2$ layer or separator layer of the DSC.

For the porous substrates it is possible to form a PCPL on one side of the substrate and a PCPL or other DSC components on the other side of the substrate.

The PCPL can have different functions in the DSC:

Back contact function. A back contact extracts electrons from the working electrode.

Counter electrode function. The counter electrode transfers electrons to the electrolyte.

Back contact and counter electrode.

A DSC can also be a hole conductor having the current in the reverse direction.

When a PCPL is used as a back contact, the PCPL is in electrical contact with the working electrode.

When a PCPL is used as a counter electrode, the PCPL is part of the counter electrode opposite to the working electrode.

Advantages of a PCPL in DCSs:

Printing is much faster than vacuum deposition techniques, such as sputtering deposition or electron beam evaporation deposition, in terms of produced deposited area and produced deposited amount per area per time unit.

Printing can be done selectively so there is no need for expensive masking, because the layers can be printed in patterns.

Printing results in less waste material compared to vacuum deposition.

Printing can be made on a variety of substrate.

Printing equipment is cheaper compared to vacuum deposition equipment.

Highly porous PCPL films can be formed allowing for fast electrolyte ion transport and fast dye-sensitization.

Thicker films can be formed without electrolyte ion transport or dye-sensitization problems.

Highly conductive porous PCPL films can be formed allowing for the printing of wider solar cell segments.

Printing technique can also be used for forming current collectors. A current collector collects electrons from the back contact and/or the counter electrode. The conductive powder layer of the current collector shall not be porous.

DETAILED DESCRIPTION OF THE INVENTION

The present invention will be further explained with reference to the following description of exemplary embodiments and accompanying drawings.

The reference to dyed $TiO_2$ as working electrode is not limited to $TiO_2$, but could be any other material or materials suitable as dyed working electrode in a DSC, such as ZnO. Likewise, the electrolyte can consist of any suitable electrolyte for a DSC or solid state hole conductors.

The porous conducting powder may be powders of metals like titanium or molybdenum, tungsten, cobalt or nickel, niobium, zirconium and their alloys. Mixtures of these metal powders or metal alloy powders can be used.

It is possible to mix in particles of conducting metal oxides to the metal particles. Particles consisting of carbides and nitrides of metals can also be mixed in. It is also possible to mix in ceramic binders such as silica nano-particles, inorganic precursors such as titanium chelates, titanates. Titanium acetyl acetonate might be used as well. Also silanes can be used.

Titanium and its alloys have high corrosion resistance capable of withstanding corrosive attack by the electrolyte. STM (grade 1-38) defines a number of titanium standards that can be used. ASTM grades (1-4), i.e., commercially pure (CP) titanium is for example useful in applications where extremely high corrosion resistance is required.

The conducting particles can have a size or diameter of around 0.1 µm and up to 15 µm, or up to 10 µm. The thickness of the PCPL can be 0.3-100 microns.

Figure 1:
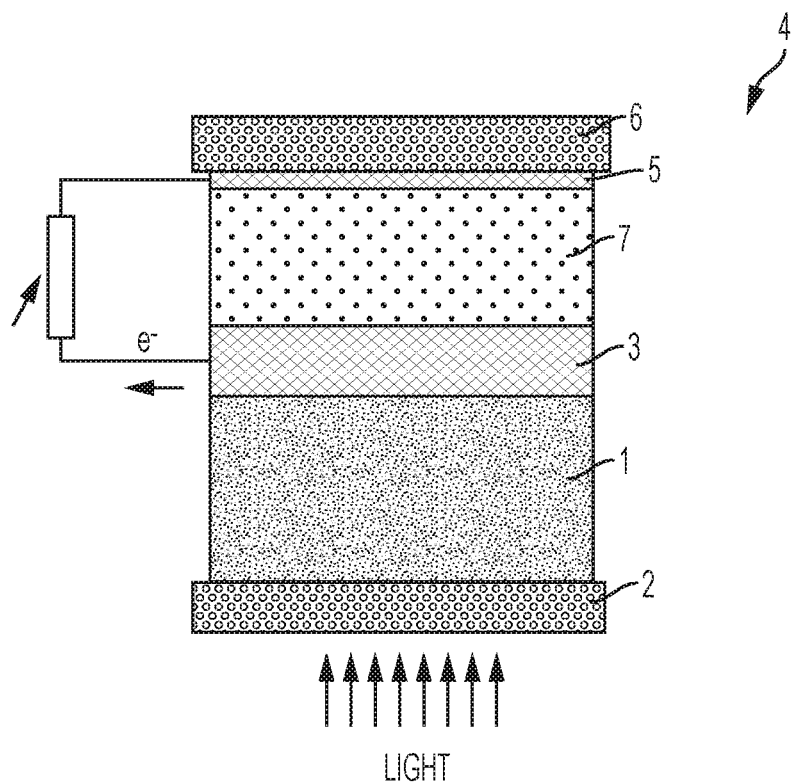
FIG. 1 shows a cross-section of a sandwich type DSC.

FIG. 1 shows a cross-section of a sandwich type DSC. A dyed $TiO_2$ working electrode layer 1 is positioned on top of a substrate 2. A PCPL 3 is positioned on top of the dyed $TiO_2$ working electrode layer 1. A counter electrode 4 having a platinized TCO layer 5 and a glass or plastic substrate 6 is positioned opposite to the working electrode 1. The electrolyte 7 is in contact with both the counter electrode and the working electrode. The electrolyte is in physical contact with the PCPL and the dyed $TiO_2$ layer, and it penetrates both the PCPL and the dyed $TiO_2$ layer.

In FIG. 1, the PCPL 3 works as a back contact to the dyed $TiO_2$ working electrode layer 1. This means that a TCO back contact layer used in conventional DSC can be omitted and be replaced by a PCPL. The porosity of the PCPL 3 allows for the electrolyte 7 to penetrate and pass through the PCPL. Photo-generated charges created in the dyed $TiO_2$ can be extracted by the PCPL.

Another variation is for the TCO layer 5 of the counter electrode 4 to be omitted and replaced by a PCPL. Such a PCPL could contain platinum to achieve the catalytic effect. Consequently, a counter electrode 4 having platinized PCPL could replace a platinized TCO layer on glass or plastic in terms of both electrical conductivity and catalytic effect.

The PCPL in the DSC can serve the function as an electron conductor in the counter electrode and/or an electron conductor and a catalytic layer in the counter electrode. This also means that the TCO layer on the counter electrode can be replaced by a PCPL.

The substrate 2 on dyed $TiO_2$ working electrode layer 1 can be glass. It is important that the substrate 2 for the dyed $TiO_2$ working electrode layer 1 in FIG. 1 is transparent in order to allow for incident light to be absorbed by the dyed $TiO_2$. The substrate 2 should have good temperature resistance in order to withstand processing at high temperatures.

Figure 2:
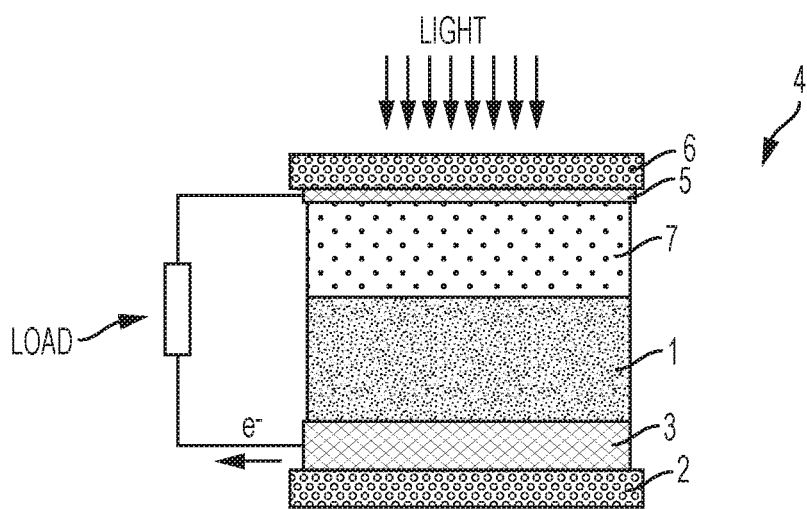
FIG. 2 shows a cross-section of a sandwich type DSC.

FIG. 2 shows a cross-section of a sandwich type DSC. A PCPL 3 has been deposited on top of a substrate 2; a working electrode layer 1 is deposited on top of the PCPL 3. A counter electrode 4 having a platinized TCO layer 5 and a glass or plastic substrate 6 is positioned opposite to the working electrode layer 1. The electrolyte 7 is in contact with both the counter electrode 4 and the working electrode 1. The electrolyte 7 is also in physical contact with the PCPL 3 and the dyed $TiO_2$ working electrode layer 1, and the electrolyte 7 penetrates both the PCPL 3 and the dyed $TiO_2$ working electrode layer 1.

Figure 3:
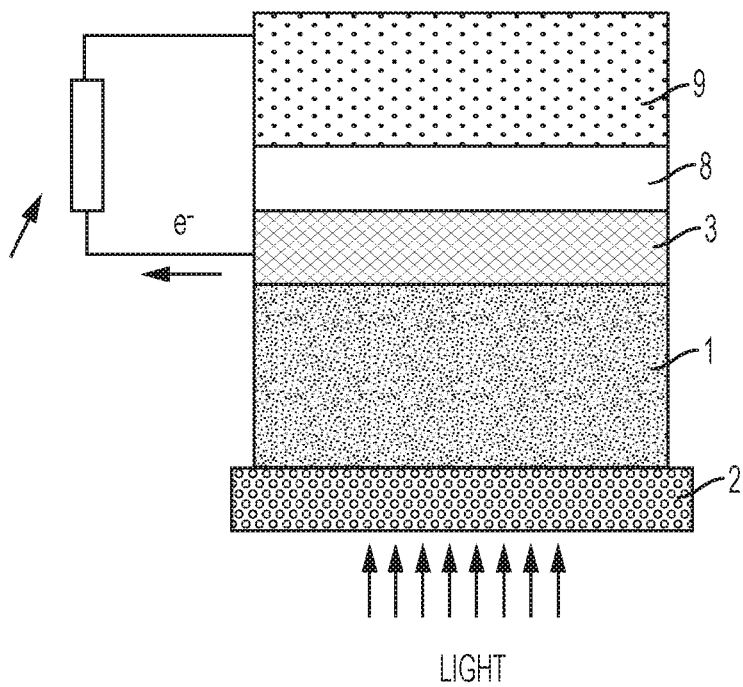
FIG. 3 shows a cross-section of a monolithic type DSC.

In FIG. 2, the PCPL 3 works as a back contact to the working electrode 1. This means that a TCO back contact layer used in conventional DSC can be omitted and be replaced by a PCPL. FIG. 3 shows a cross-section of a monolithic type DSC. A dyed $TiO_2$ working electrode layer 1 is positioned on top of a substrate 2. A PCPL 3 is positioned on top of working electrode layer 1. A porous separator 8 is deposited on top of the PCPL 3. A porous counter electrode 9 is deposited on top of the separator 8. The electrolyte (not shown in FIG. 3) is in contact with the counter electrode 9 and the separator 8 and the PCPL 3 and the dyed $TiO_2$ working electrode layer 1. The electrolyte penetrates the porous counter electrode 9 and the separator 8 and the PCPL 3 and the dyed $TiO_2$ working electrode layer 1.

In FIG. 3, the PCPL 3 works as a back contact to the working electrode 1. This means that a TCO back contact layer used in conventional DSC can be omitted and be replaced by a PCPL. The porosity of the PCPL allows for electrolyte to penetrate the PCPL and pass through the PCPL. The photo-generated charges created in the dyed $TiO_2$ can be extracted by the PCPL. Since the PCPL is electrically conductive, the need for a TCO layer for charge extraction is reduced.

A variation to FIG. 3 could be that the porous counter electrode is made as a PCPL. Such PCPL could comprise platinum in order to increase the catalytic effect.

The substrate 2 on dyed $TiO_2$ working electrode layer 1 can be glass. It is important that the substrate 2 for the dyed $TiO_2$ working electrode layer 1 in FIG. 1 is transparent in order to allow for incident light to be absorbed by the dyed $TiO_2$. The substrate 2 should have good temperature resistance in order to withstand processing at high temperatures.

The separator 8 is a porous and chemically inert and poorly electrically conductive oxide, such as alumina, aluminosilicate, magnesia, silica, and zirconia. The separator material should also be substantially inert to the electrolyte and the dye sensitization processes. The separator layer 8 should bond well to the PCPL 3 and provide adequate electrical insulation as well as good porosity and electrolyte permeation at minimal ohmic drop in the electrolyte. It is possible to form a separator layer by multiple depositions of chemically inert and poorly conducting layers of the same or different materials. It is also possible to form a separator layer by the deposition of alternating layers of chemically inert and poorly electrically conductive layers.

The porous counter electrode 9 comprises conventional carbon-based materials such as graphite, carbon black, and platinum particles. Carbon nano-tubes or -cones can also be used in such mixtures.

The porous counter electrode 9 normally comprises a catalytic layer and a conducting layer. The catalytic layer is adapted to accommodate the iodine redox reaction in the cell. In direct contact with the catalytic carbon layer is a conductive carbon layer.

Figure 4:
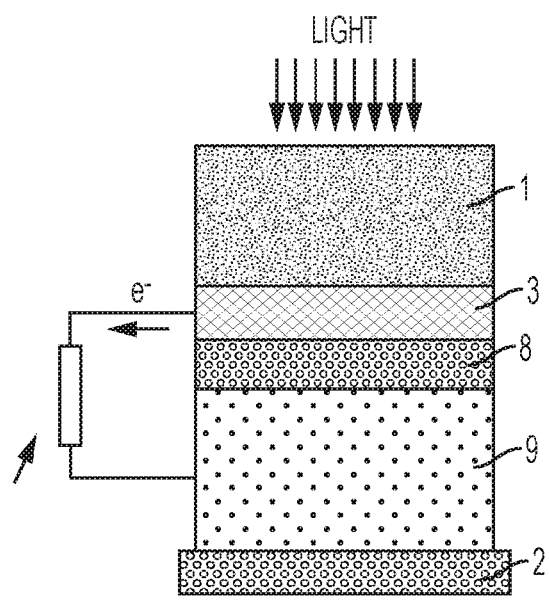
FIG. 4 shows a cross-section of a monolithic type DSC.

FIG. 4 shows a cross-section of a monolithic type DSC. A porous counter electrode 9 is deposited on top of a substrate 2, a separator 8 is deposited on top of the porous counter electrode 9, a PCPL 3 is formed on top of the separator 8, and a dyed $TiO_2$ working electrode layer 1 is deposited on top of the PCPL 3. The electrolyte (not shown in FIG. 4) is in contact with the counter electrode 9, the separator 8, the PCPL 3, and the working electrode 1. In FIG. 4, the PCPL 3 works as a back contact to the working electrode 1. This means that a TCO back contact layer used in conventional DSC can be omitted and be replaced by a PCPL. A variation to FIG. 4 could be that the porous counter electrode is replaced with a PCPL. Such a PCPL could contain platinum particles in order to increase its catalytic effect.

The substrate 2 on the porous counter electrode 9 can be a glass substrate or a metal foil substrate.

In order to produce the DCS shown in FIGS. 1 to 4 the cells are sealed and additionally, electrical connections are made so that the photo-generated current can be used in an external electrical circuit.

A conductive powder layer, CPL, can be used as a current collector. Parallel and/or series cell interconnections consisting of CPL can be printed selectively without using masks.

Figure 5:
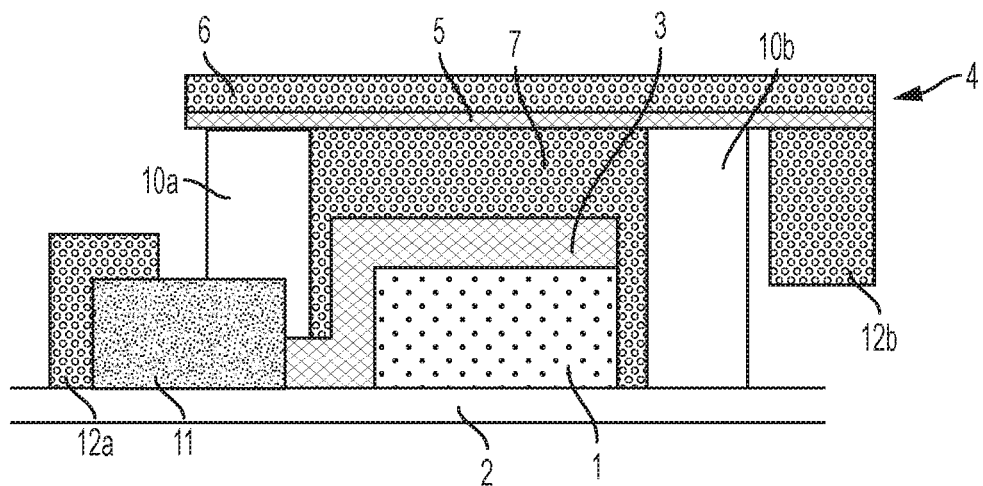
FIG. 5 shows a solar cell device based on the cell shown in FIG. 1.

FIG. 5 shows a solar cell device based on the cell shown in FIG. 1.

FIG. 5 shows how the cell geometry in FIG. 3 can be implemented in a solar cell device. A sealing compound 10*a, b* is deposited around all the edges of the cell to encapsulate the DSC components in order to prevent mass transfer between the cell and the surrounding environment. It can be seen that the PCPL 3 is formed on top of the working electrode 1 and on the substrate 2 next to one side of the working electrode 1 in such a way that the photocurrent from the dyed $TiO_2$ is conducted down and away from the dyed $TiO_2$ to a CPL 11. The CPL 11 is formed on top the outer end of the PCPL 3. A layer of conducting silver or other conductive material capable of current transport 12*a* is deposited on top of the CPL. Conducting silver 12*b* is also deposited on top of the TCO layer on the counter electrode.

The second CPL forms an electrical junction between the conducting silver and the PCPL. In order to achieve as secure seal as possible across this junction, and to minimize the possibility of contamination of both the DSC components and the environment surrounding the cell, the CPL should have an adequate thickness and a very low porosity.

The current can be collected in an external circuit (not shown in the figure) via the conducting silver 12*a, b*.

Figure 6:
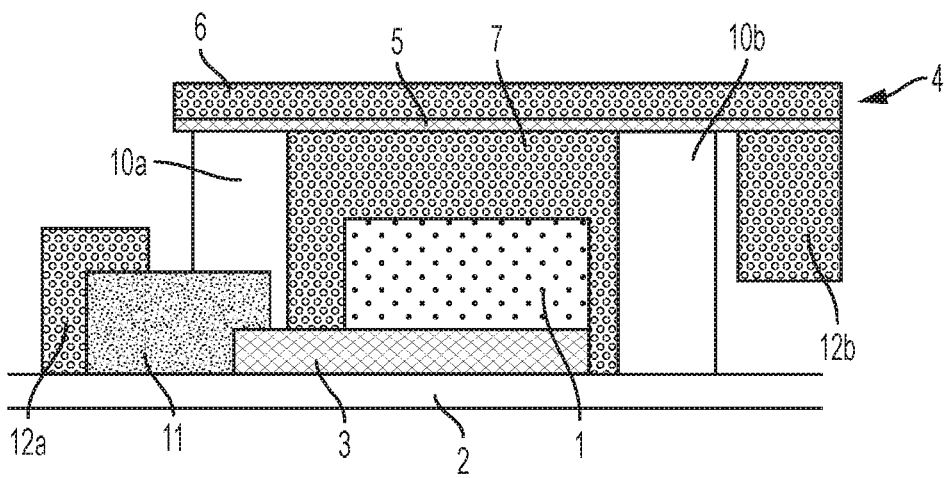
FIG. 6 shows a solar cell based on FIG. 2.

FIG. 6 shows a solar cell based on FIG. 2.

FIG. 6 shows how the cell geometry in FIG. 2 can be implemented in a device. A sealing compound 10*a, b* is deposited around all the edges of the cell to encapsulate the DSC components. It can be seen that the PCPL 3 is formed below of the working electrode 1 and next to one side of the working electrode in such a way that the photocurrent from the dyed $TiO_2$ is conducted away from the dyed $TiO_2$ to a CPL 11. A thicker CPL 11 is deposited on top the outer end of the PCPL 3. A layer of conducting silver 12*a* is deposited on top of the CPL 11. Conducting silver 12*b* is also deposited on top of the TCO layer 5 of the counter electrode 4.

The CPL 11 forms an electrical junction between the conducting silver 12*a* and the PCPL. The CPL 11 preferably has as low porosity as possible.

The generated current can be collected in an external circuit (not shown in the figure) via the conducting silver.

Figure 7:
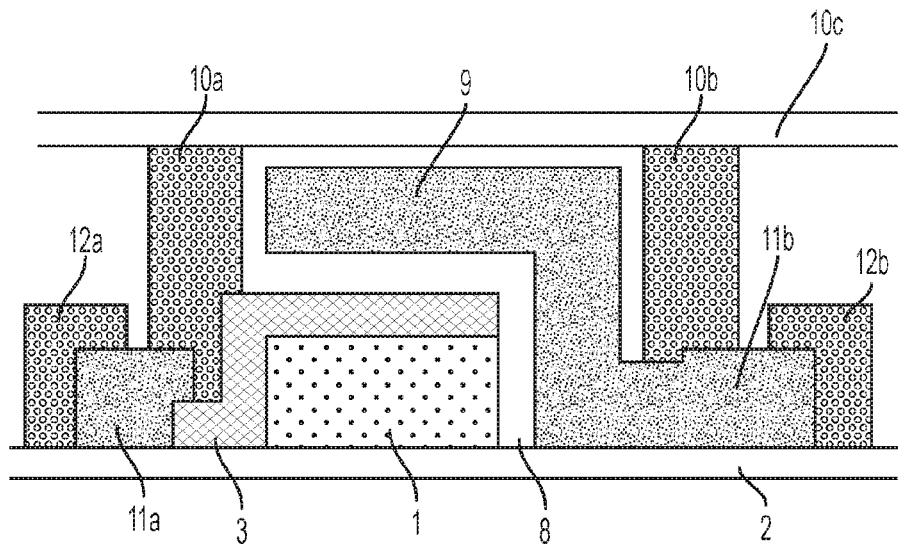
FIG. 7 shows how the cell geometry in FIG. 3 can be implemented in a device.

FIG. 7 shows how the cell geometry in FIG. 3 can be implemented in a device. A sealing compound 10*a, b, c* is deposited around all the edges of the cell to encapsulate the DSC components. It can be seen that the PCPL 3 is formed on top of the working electrode 1 and on the substrate 2 next to one side of the working electrode 1 in such a way that the photocurrent from the dyed $TiO_2$ working electrode is conducted down and away from the dyed $TiO_2$ to a CPL 11*a*. The CPL 11*a* is deposited on top of the outer end of the PCPL 3. A layer of conducting silver 11*a* is deposited on top of the CPL 11. A separator 8 is deposited on top of and next to the PCPL 3. A porous counter electrode 9 is deposited on top of and next to the separator 8. A second CPL 11*b* is deposited connecting the porous counter electrode 9 with the conducting silver 12*b*.

CPL 11*a, b* form an electrical junction between the conducting silver and the PCPL.

The generated current can be collected in an external circuit (not shown in the figure) via the conducting silver.

Figure 8:
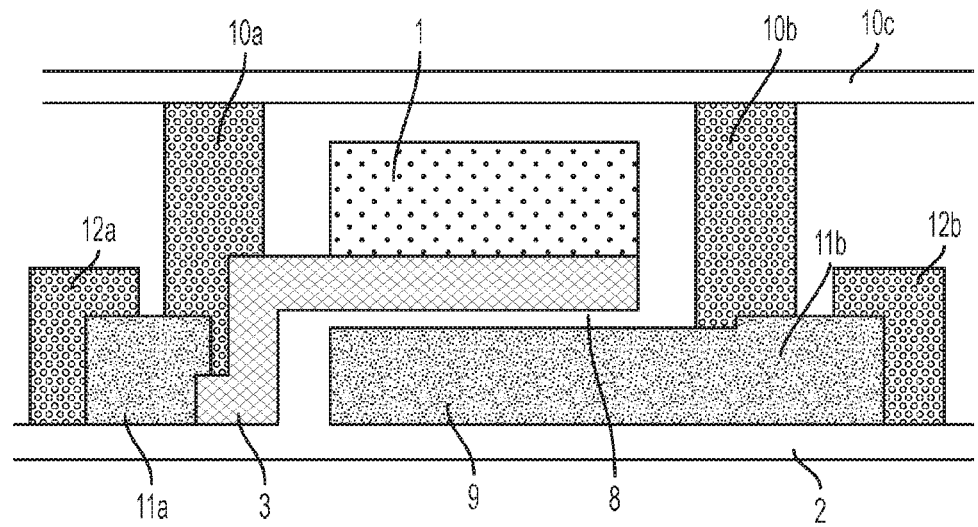
FIG. 8 shows how the cell geometry in FIG. 4 can be implemented in a device.

FIG. 8 shows how the cell geometry in FIG. 4 can be implemented in a device. A sealing compound 10*a, b, c* is deposited around all the edges of the cell to encapsulate the DSC components. It can be seen that the PCPL is formed on top of the working electrode 1 and on the substrate 2 next to one side of the working electrode 1 in such a way that the photocurrent from the dyed $TiO_2$ is conducted down and away from the dyed $TiO_2$ to a CPL 11*a*. The CPL 11*a* is deposited on top of the outer end of the PCPL 3. A layer of conducting silver 12*a* is deposited on top of the CPL 11*a*. The separator 8 is deposited on top of and next to one side of a porous counter electrode 9 on the substrate 2. A CPL 12*b* is deposited on top of the porous counter electrode 9.

The CPL 11*a* forms an electrical junction between the conducting silver 12*a* and the PCPL 3. The CPL 11*b* forms an electrical junction between the conducting silver 12*b* and the porous counter electrode 9.

The generated current can be collected in an external circuit (not shown in FIG. 8) via the conducting silver.

For the porous substrates, it is possible to deposit DSC components on both sides of the substrate. For example, it possible to form a PCPL on one side of a porous glass microfiber-based substrate and a $TiO_2$ working electrode on the other side of the glass microfiber-based substrate. The porosity of the glass microfiber-based substrate allows for mechanical contact and electronic contact between the PCPL and the dyed $TiO_2$ working electrode layer. Thus, the PCPL will function as a back contact to the dyed $TiO_2$ layer. Consequently, the glass microfiber-based substrate will serve as a porous substrate matrix for formation of the PCPL and $TiO_2$ working electrode, and it will also serve the purpose of reinforcing the mechanical stability of the PCPL and $TiO_2$ working electrode layers. By depositing a separator layer on top of the PCPL and by depositing a porous counter electrode on top of the separator layer and by filling the porous structure with an electrolyte, a basic DSC device is formed.

Alternatively, it is possible to form the PCPL on one side of a porous glass microfiber-based substrate, and a separator layer on the other side of the glass microfiber-based substrate. A porous counter electrode layer could then be deposited on top of the separator layer. Consequently, such geometry could be used as a back contact and counter electrode. By depositing a $TiO_2$ layer on top of the PCPL and by filling the porous structure with an electrolyte, a basic DSC is formed. The porous counter electrode could consist of conventional carbon-based materials or a PCPL with adequate catalytic properties.

Alternatively, it is possible to form the PCPL on one side of a porous glass microfiber-based substrate, and to deposit $TiO_2$ on the other side of the glass microfiber-based substrate.

The above examples are in no way exhaustive.

The DSC cells manufactured on porous substrates must be sealed in order to ensure the integrity of the DSC components.

Sealing can be made for example by placing the porous substrate including all deposited DSC components between two sheets of glass and by sealing the edges of the two glass sheets. Additionally, electrical connections have to be made such that the generated current can be used in an external electrical circuit.

The manufacturing of the PCPL layer comprises 6 steps:
Powder preparation
Powder ink preparation
Powder ink deposition
Powder layer heating
Powder layer compaction
Powder layer after treatment Powder Preparation A starting powder of a suitable composition can have particle sizes ranges from 0.1 to 10 micrometer. It is preferred that the maximum particle size is kept below 10 μm or below 1 μm. An amount below 50% by weight of the total particle content could be particles with diameters below 0.1 μm. Mixtures of particles with different particle sizes can be used.

The particles may be spherical and/or irregular-shaped.

Metal oxide on the metal particle surface prevents good metallic inter-particle contact. Removal of the oxide layer on the metal particles can be made by pre-treating the metal particles through heating in an inert atmosphere, vacuum, or reducing atmosphere. If mixtures of titanium and titanium hydrides are used, then the titanium hydride can serve as a hydrogen source during the heating procedure. The oxide layer on the titanium particles can also be removed by chemical methods, such as chemical milling and pickling using standard chemical agents. The cleaning chemicals used in standard welding practice can be used as well.

It is possible to mix in catalytic amounts of platinum with the titanium powder for forming counter electrodes in the DSC. The metal powder can also be treated separately with platinum salts to achieve a deposition of platinum on the surface of the metal particles. It is possible to mix in particles of conductive metal oxides to the metal particles, such as ITO, ATO, PTO, FTO. Particles consisting of conductive metal carbides and metal nitrides can also be mixed with the metal powder.

Powder Ink Preparation

Water can be used as a solvent for the ink. Organic solvents, such as terpenes, alcohols, glycolethers, glycol ether acetates, ketones, hydrocarbons, and aromatic solvents, may also be used. Chlorinated solvents, however, should be avoided.

Binders, or other such substances, can be used to enhance the mechanical strength of the deposited conductive powder layer before heating the layer.

Ink Deposition

The conductive powder ink can be deposited by conventional printing techniques. Examples of printing techniques are; slot die coating, gravure, spraying, screen printing, knife coating, blade coating, doctor blading, or dip coating.

Screen printing is preferable for powder deposition for manufacturing DSC because deposition can be made selectively, and a few micrometers up to tens of micrometer thick layers can easily be deposited on a wide variety of substrates such as rigid, flexible, or porous substrates. Dip coating is advantageous in cases where both sides of the substrate are to be covered simultaneously, thus reducing the number of process steps. Slot die coating can be used for roll-to-roll production of flexible substrates.

The conductive powder ink can be deposited onto various substrates like plastics, PET, PEN, TCO-less glass, TCO-covered glass, glass, metal, or porous substrates such as glass microfiber-based substrates, ceramic microfiber-based substrates, metal mesh, porous metal, cellulose-based substrates, textile, or onto the $TiO_2$ layer or separator layer of the DSC.

Conductive Powder Layer Heating

After the conductive powder ink has been deposited, the solvent is removed by heating in air or an inert atmosphere to create a dry powder layer.

Non-volatile organic substances can be removed by oxidation or reduction by heating, in an oxidizing or reducing atmosphere, respectively.

It is possible to remove non-volatile inorganic substances such as inorganic pore formers like ammonium carbonate, in the dry conductive powder layer. Non-volatile inorganic substances such as ammonium carbonate can be removed by decomposition at elevated temperatures in air, nitrogen, or vacuum.

Conductive Powder Layer Compaction

Compaction of the dry conductive powder layer is desired in order to form a PCPL. The PCPL shall have sufficient mechanical strength to withstand handling of the DSC. A contact between the powder particles in order to achieve electrical conductivity while maintaining sufficient porosity to allowing the electrolyte to circulate should be achieved. The strength of the compressed PCPL depends on the mechanical interpenetration of powder particle irregularities favored by plastic deformation. The use of only spheroidical metal particles in the PCPL results in less interpenetration of neighboring particles and lower mechanical strength. The use of irregular-shaped metal particles in the PCPL results in more interpenetration of neighboring particles and higher mechanical strength. High compaction force results in lower PCPL porosity and lower PCPL permeability; the higher the compaction pressure, the more compact and mechanically stable the PCPL becomes. A pressure range within 10-2000 $kg/cm^2$ or within the range of 10-200 $kg/cm^2$ is normally required in order to achieve a density of around 40%-70%.

Several compaction methods are available, including isostatic compaction, die compaction, and roll compaction. Roll compaction is, for example, economical and results in a uniform PCPL density with tight dimensional tolerances. Heat can be applied to the compaction tool during compaction. Also ultrasonic vibration can be applied to the compaction tool during compaction.

Using pressure plates to form the PCPL can be advantageous for brittle substrates.

It is possible to use compaction tools with micro-structured surfaces in order to transfer the surface microstructure surface to the powder layer during compaction. The surface microstructure of the compaction tool could have e.g. pyramidal-shape, sinusoidal-shape, or zig-zag-shape. Rendering a surface microstructure to the PCPL layer could be useful in order to achieve optical effects, such as enhanced light absorption in the DSC. Alternatively, this type of treatment can be performed in the PCPL after treatment, see below.

In order to avoid that the PCPL layer sticks to the press tools, release materials can be used.

If the PCPL layer is deposited onto a flat non-sticking substrate such as molybdenum or yttrium oxide, the PCPL can be removed from the substrate to create a free-standing PCPL.

PCPL After Treatment

Any organic substances remaining in the compacted PCPL can be removed by heating.

Non-volatile inorganic substances, such as inorganic pore formers like ammonium carbonate, remaining in the dry PCPL, can be removed by decomposition at elevated temperatures in air, nitrogen, or vacuum.

In the event that titanium hydride is used, it may serve as the hydrogen source.

In order to improve the metallic particle-to-particle contact, the compacted PCPL can be subjected to sintering by applying heat. Sintering causes diffusion across the metallic particle grain boundaries to achieve higher mechanical strength; specifically, mechanical strength and corrosion resistance properties are dependent on the interaction with the sintering atmosphere.

Porous materials are commonly sintered in inert atmospheres such as argon or vacuum, or they can be sintered in reducing atmospheres such as hydrogen-argon mixtures, nitrogen-hydrogen mixtures, or hydrogen and dissociated ammonia. In the event that titanium hydride is used, it serves as the hydrogen source. Titanium is highly reactive and requires good vacuum sintering, or sintering in dry argon with a high purity, inert backfill gas.

It is also possible to apply post-etching in order to increase the porosity of the PCPL layer.

It is possible to perform several different consecutive after treatment steps: e.g., first removing any remaining non-volatile organic substances in the PCPL by heating the PCPL in an oxidative atmosphere such as air, and then applying heat to sinter the PCPL.

It is possible to apply further compaction to reduce variations in thickness, in order to achieve a more well-defined thickness of the PCPL.

It is possible to apply compaction using microstructure tools to achieve a micro-structured surface on the PCPL.

The porosity of the PCPL can vary between 15% and 85%. A porosity between 40% and 70%, or between 50% and 60%, is preferred.

The thickness of the PCPL can be in the range of 1-100 microns.

Example 1

A PCPL in a DSC was formed by screen printing a conductive powder ink containing terpineol and titanium metal powder onto a porous glass-fiber substrate. The deposited conductive powder layer was dried at 120° C. in air for 3 minutes. The deposited layer was then compacted to yield a porosity of 55%. The thickness of the roll compacted PCPL was 32 µm. Subsequently, the PCPL was subjected to sintering by flash heating in an inert atmosphere (argon). The sheet resistance of the PCPL was less than 1 ohm per sq.

Example 2

A PCPL in a DSC was formed by depositing a conductive powder ink containing water and titanium metal powder onto a porous ceramic $Al_2O_3$ fiber substrate. The deposited conductive powder layer was dried at 120° C. in air for 10 minutes. The deposited conductive powder layer was thereafter compacted to yield a porosity of 46%. The thickness of the roll compacted PCPL was 24 µm. Subsequently, the PCPL was subjected to flash heating in an inert atmosphere (argon). The sheet resistance of the PCPL was less than 1 ohm per square.

Example 3

A PCPL in a DSC was formed by depositing a conductive powder ink containing hydrocarbon solvent and titanium metal powder onto a porous glass-fiber substrate. The deposited conductive powder layer was dried at 120° C. in air for 3 minutes. The deposited layer was then compacted to yield a porosity of 51%. Subsequently, the PCPL was subjected to sintering by flash heating in an inert atmosphere (argon) using a Sinteron 2000. The sheet resistance of the film was less than 1 ohms per square.

Next, a conductive powder was deposited on the opposite side of the glass-fiber substrate. The second deposition was performed using a conductive powder ink containing hydrocarbon solvent and titanium metal powder. The titanium metal powder contained small platinum metal particles deposited onto the surface of the titanium metal particles. The second conductive powder layer was dried at 120° C. in air for 3 minutes. The layer was then compacted to yield a porosity of 49%. Subsequently, the second compacted PCPL was subjected to flash heating in an inert atmosphere (argon) using a Sinteron 2000. The sheet resistance of the film was less than 1 ohms per square.

Example 4

A PCPL in a DSC was formed by depositing a conductive powder ink containing terpineol and titanium metal powder onto a porous glass-fiber substrate. The deposited conductive powder layer was dried at 120° C. in air for 3 minutes. The deposited layer film was then compacted to yield a porosity of 62%. The thickness of the PCPL was 21 µm. Subsequently, the PCPL was subjected to flash heating in an inert atmosphere (argon). The sheet resistance of the film was less than 1 ohm per square.

Next, a second conductive powder was deposited on top of the first PCPL. The second deposition was performed using an ink containing isopropanol and titanium metal powder. The conductive powder layer was dried at 120° C. in air for 3 minutes. The layer was then compacted. Subsequently, the second PCPL was subjected to flash heating in an inert atmosphere (argon) using a Sinteron 2000. The sheet resistance of the double layer PCPL was less than 1 ohm per square.

Example 5

A PCPL in a DSC was formed by screen printing a conductive powder ink containing terpineol and titanium hydride powder onto a porous glass-fiber substrate. The deposited conductive powder layer was dried at 120° C. in air for 3 minutes. The deposited layer was then compacted to yield a porosity of 57%. The thickness of the compacted PCPL was 20 µm. Subsequently, the PCPL was subjected to flash heating in an inert atmosphere (vacuum). The sheet resistance of the PCPL was less than 1 ohms per square.

Example 6

A PCPL in a DSC was formed by screen printing a conductive powder ink containing terpineol and titanium hydride powder onto a molybdenum sheet. The deposited conductive powder layer was dried at 120° C. in air for 3 minutes. The deposited layer was then compacted to yield a porosity of 50%. The thickness of the compacted PCPL was 20 µm. Subsequently, the PCPL was subjected to sintering by flash heating in vacuum. The PCPL layer could be removed from the molybdenum sheet in the form of a free-standing film. The sheet resistance of the PCPL was less than 1 ohms per square.

The invention claimed is:

1. A method for producing a Dye-Sensitized Solar cell (DSC) comprising a substrate, a working electrode, a back contact for extracting photo-generated electrons, an electrolyte, and a counter electrode wherein the back contact and/or the counter electrode 5 is formed by a porous conductive powder layer, PCPL; wherein preparation of the PCPL comprises the following steps:
   a. powder preparation;
   b. powder ink preparation;
   c. powder ink deposition; wherein step c comprises compacting the powder by compaction tools with microstructured surfaces in order to transfer the surface microstructure surface to the powder layer during compaction;
   d. powder layer heating;
   e. powder layer compaction; wherein step e is performed by compacting the powder layer to a porosity of 5% to 85%, or 40% to 70%, or 50% to 60%; and
   f. powder layer after treatment.

2. A method in accordance with claim 1, wherein step c is performed by printing.

3. A method in accordance with claim 2, wherein step c is performed by screen printing.

4. A method in accordance with claim 1, wherein step f comprises a heat treatment.

5. A method in accordance with claim 4, wherein the heat treatment is where a sintering effect between the powder particles occur.

6. A method in accordance with claim 4, wherein the heat treatment is rapid annealing treatment.

7. A method in accordance with claim 1, wherein the conductive powder is a powder of a metal.

8. A method in accordance with claim 2 wherein step f comprises a heat treatment.

9. A method in accordance with claim 3 wherein step f comprises a heat treatment.

10. A method in accordance with claim 4, wherein the heat treatment is flash heating.

11. A method in accordance with claim 1, wherein the conductive powder is a powder of at least one metal selected form the group consisting of titanium, nickel, molybdenum, tungsten, cobalt, niobium, zirconium and their alloys.

12. A Dye-Sensitized Solar cell (DSC) comprising a substrate, a working electrode, an electrolyte, a back contact for extracting photo-generated electrons, and a counter electrode for transferring electrons to the electrolyte, wherein the back contact and/or the counter electrode comprise a porous conductive powder layer (PCPL)$_s$ wherein the PCPL of the counter electrode comprises catalytic amounts of platinum.

13. A DSC in accordance with claim 12, wherein the substrate comprise a TCO-less glass or TCO-covered glass, plastics, a porous substrate, glass microfiber-based substrates, or ceramic microfiber-based substrates.

14. A DSC in accordance with claim 13, wherein the plastics comprise PET or PEN and the porous substrate is a cellulose-based substrate.

15. A DSC, comprising a substrate, a working electrode, an electrolyte, a back contact for extracting photo-generated electrons, and a counter electrode for transferring electrons to the electrolyte, wherein the back contact and/or the counter electrode comprise a porous conductive powder layer (PCPL), wherein the substrate comprise a porous substrate which is in contact with the PCPL on one side and the PCPL, the working electrode, or the separator, on the other side.

* * * * *